United States Patent [19]

Niki et al.

[11] Patent Number: 5,100,768

[45] Date of Patent: Mar. 31, 1992

[54] PHOTOSENSITIVE COMPOSITION

[75] Inventors: Hirokazu Niki; Yasunobu Onishi, both of Yokohama; Yoshihito Kobayashi, Kawasaki; Rumiko Hayase, Yokohama, all of Japan

[73] Assignee: Kabushiki Kaisha Toshiba, Kawasaki, Japan

[21] Appl. No.: 519,397

[22] Filed: May 4, 1990

[30] Foreign Application Priority Data

May 9, 1989 [JP] Japan .................. 1-115478
Dec. 20, 1989 [JP] Japan .................. 1-328242

[51] Int. Cl.$^5$ .......................... G03C 1/725; C08F 2/46
[52] U.S. Cl. ................................. 430/281; 430/270; 430/271; 522/173
[58] Field of Search .................. 430/281, 270, 271; 522/173

[56] References Cited

U.S. PATENT DOCUMENTS

| | | | |
|---|---|---|---|
| 4,251,619 | 2/1981 | Kurita .................. | 430/281 |
| 4,594,306 | 6/1986 | Stahlhofen et al. ........ | 430/302 |
| 4,910,119 | 3/1990 | Schneller et al. ........ | 430/270 |
| 4,943,516 | 7/1990 | Kamayachi et al. ........ | 430/281 |

FOREIGN PATENT DOCUMENTS

| | | |
|---|---|---|
| 0111274 | 1/1986 | European Pat. Off. . |
| 2121126 | 8/1972 | France . |

OTHER PUBLICATIONS

Chemical Reviews, vol. 70, No. 2, Apr. 1970 "The Photochemical Reactions of Azoxy Compounds, Nitrones, and Aromatic Amine N-Oxides" Gavin G. Spence, et al.

*Primary Examiner*—Marion E. McCamish
*Assistant Examiner*—Mark A. Chapman
*Attorney, Agent, or Firm*—Oblon, Spivak, McClelland, Maier & Neustadt

[57] ABSTRACT

A photosensitive composition contains an alkali-soluble polymer having a phenol skeleton in its structure and a heterocyclic compound represented by formula (I-1) or (I-2), formula (II-1) or (II-2), any of formulas (III-1) to (III-8), any of formulas (IV-1) to (IV-12), or any of formulas (V-1) to (V-4) described in the claims and specification. A photosensitive composition containing a heterocyclic compound represented by formula (I-1) or (I-2), any of formulas (III-1) to (III-8), any of formulas (IV-1) to (IV-12), or any of formulas (V-1) to (V-4) can be suitably used as a negative resist. A photosensitive composition containing a heterocyclic compound represented by formula (II-1) or (II-2) can be suitably used as a positive resist. A photosensitive composition containing an alkali-soluble polymer having a phenol skeleton in its structure and a polymer having a nitrogen-containing heterocyclic compound as a polymeric unit is also included in this invention. The latter photosensitive composition can further contain a heterocyclic compound represented by any of formulas (VI-1) to (VI-15) described in the claims and specification.

12 Claims, No Drawings

PHOTOSENSITIVE COMPOSITION

BACKGROUND OF THE INVENTION

1. Field of the Invention

The present invention relates to a photosensitive composition and, more particularly, to a photosensitive composition photosensitive to deep UV light.

2. Description of the Related Art

In recent years, a demand has arisen for high-density integration for realizing multifunctional high-density electronic equipment, and finer patterns to be formed in electronic parts have been required accordingly.

In the manufacture of electronic parts such as semiconductor ICs requiring various types of micropatterning techniques, a photosensitive resin is widely used in formation of fine patterns. As an exposure apparatus for use in formation of patterns using a photosensitive resin, a step-and-repeat reduction-projecting type mask aligner called a stepper is conventionally known. Examples of light for use in such an apparatus are g rays (wavelength = 436 nm), h rays (wavelength = 405 nm), and i rays (wavelength = 365 nm) of a mercury lamp, and XeF (wavelength = 351 nm), XeCl (wavelength = 308 nm), KrF (wavelength = 248 nm), KrCl (wavelength = 222 nm), ArF (wavelength = 193 nm), and $F_2$ (wavelength = 157 nm) of an excimer laser. In order to form fine patterns, the wavelength of light to be used is preferably short. Therefore, a demand has arisen for a resist sensitive to deep UV light such as an excimer laser.

A conventional known example of a photosensitive resin photosensitive to an excimer laser is a photosensitive composition consisting of an acryl-based polymer such as polymethylmethacrylate (PMMA) or polyglutarmaleimide (PGMI) or a polymer having phenol and an azide-based photosensitizing agent. A photosensitive composition using the former polymer, however, dry etching resistance. Although a photosensitive composition using the latter polymer has high sensitivity and a high dry etching resistance, a sectional shape of a pattern formed by using this photosensitive composition becomes an inverted triangle. Therefore, there is a problem that it is difficult to control exposure and development steps.

SUMMARY OF THE INVENTION

It is an object of the present invention to provide a photosensitive composition which has high sensitivity to radiation having a short wavelength such as deep UV light, a high dry etching resistance, and a wide allowance in controlling exposure and development steps, and can form a fine pattern having a good sectional shape.

The above object of the present invention is achieved by the following photosensitive compositions (A) to (F) having an alkali-soluble polymer having a phenol skeleton and a photosensitizing agent.

Photosensitive Composition (A)

A photosensitive composition containing an alkali-soluble polymer having a phenol skeleton in its structure and a heterocyclic polymer represented by the following formula (I-1) or (I-2):

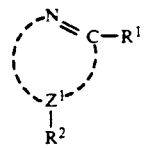

(I-1)

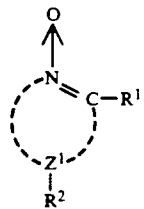

(I-2)

wherein $Z^1$ represents nonmetal atoms required to form a heterocyclic ring containing nitrogen, and $R^1$ and $R^2$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

Photosensitive Composition (B)

A photosensitive composition containing an alkali-soluble polymer having a phenol skeleton in its structure and a heterocyclic polymer represented by the following formula (I-1) or (I-2):

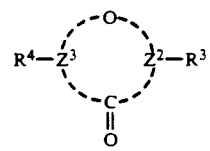

wherein $Z^2$ and $Z^3$ may be the same or different and independently represent nonmetal atoms required to form a heterocyclic ring containing oxygen, and $R^3$ and $R^4$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

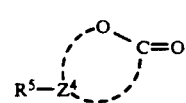

(II-2)

wherein $Z^4$ represents nonmetal atoms required to form a heterocyclic ring containing oxygen, and $R^5$ represents a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

Photosensitive Composition (C)

A photosensitive composition containing an alkali-soluble polymer having a phenol skeleton in its structure and a heterocyclic polymer represented by one of the following formulas (I-1) or (I-8):

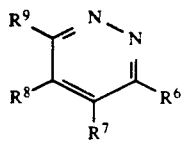
(III-1)

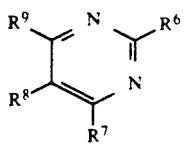
(III-2)

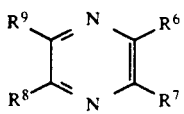
(III-3)

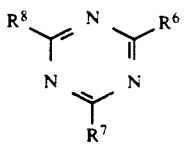
(III-4)

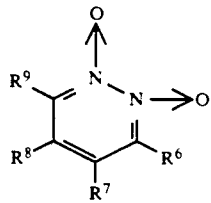
(III-5)

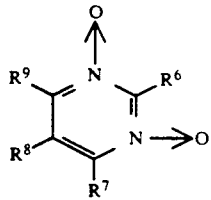
(III-6)

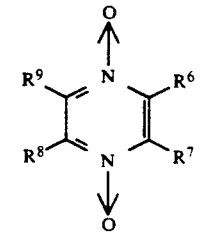
(III-7)

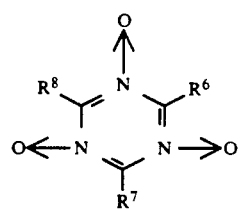
(III-8)

wherein $R^6$ to $R^9$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

Photosensitive Composition (D)

A photosensitive composition containing an alkali-soluble polymer having a phenol skeleton in its structure and a heterocyclic polymer represented by one of the following formulas (I-1) or (I-12):

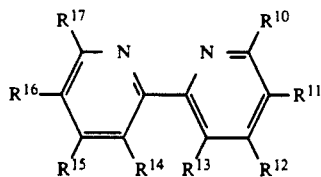
(IV-1)

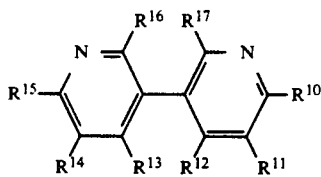
(IV-2)

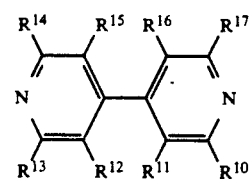
(IV-3)

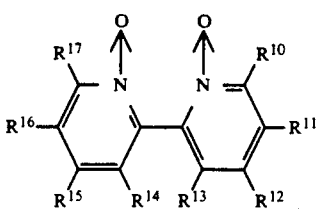
(IV-4)

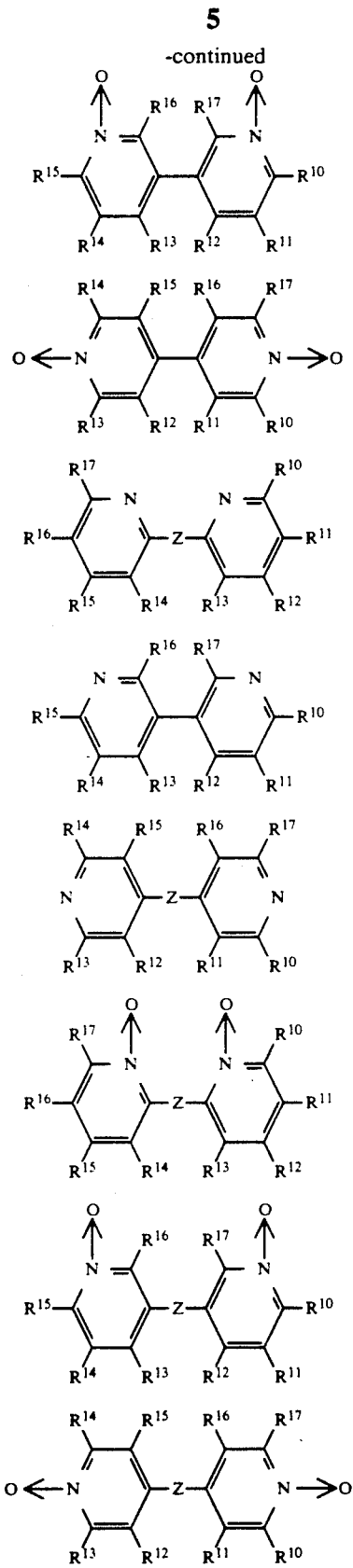

having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom, and Z represents a divalent organic group.

Photosensitive Composition (E)

A photosensitive composition containing an alkali-soluble polymer having a phenol skeleton in its structure and a pyridinium salt represented by one of the following formulas (V-1) or (V-4):

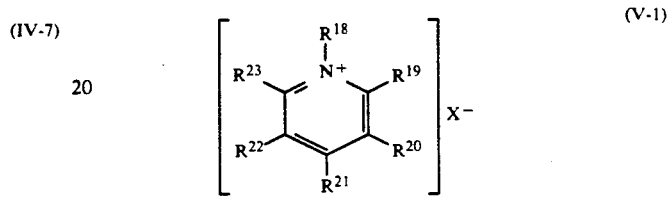

(V-1)

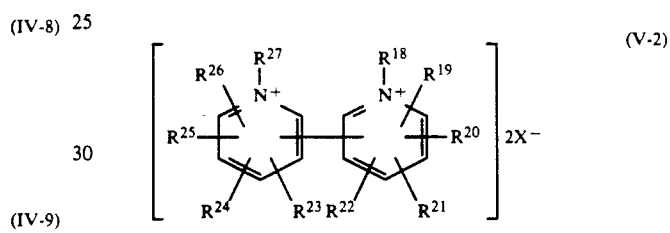

(V-2)

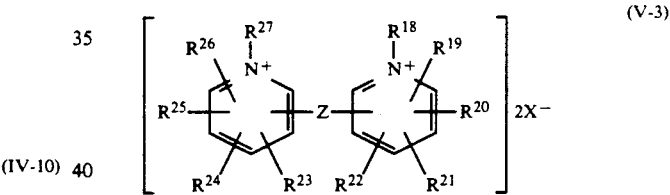

(V-3)

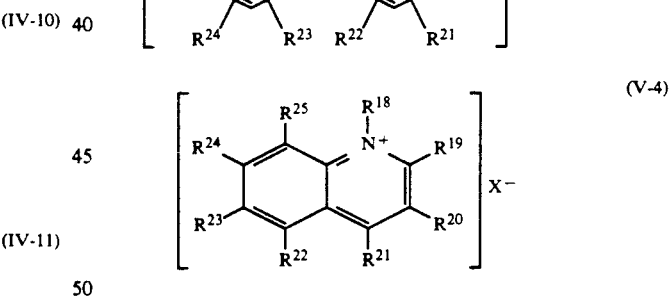

(V-4)

wherein $R^{18}$ $R^{27}$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom, $X^-$ represents an anion, and Z represents a divalent organic group.

Photosensitive Composition (F)

A photosensitive composition containing an alkali-soluble polymer having a phenol skeleton in its strucwherein $R^{10}$ $R^{17}$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group ture and a polymer having a nitrogen-containing heterocyclic compound as a polymeric unit.

Of the above photosensitive compositions (A) to (F), the photosensitive compositions (A) and (C) to (F) can be suitably used as a negative resist. The photosensitive composition (B) can be suitably used as a positive resist.

DETAILED DESCRIPTION OF THE PREFERRED EMBODIMENTS

The photosensitive compositions according to the present invention will be described in detail below.

Examples of the alkali-soluble polymer having a phenol skeleton in its structure are a phenol novolak resin; a substituted phenol novolak resin such as cresol novolak resin and a xylenol novolak resin; a vinylphenolic resin; an isopropenylphenolic resin; a copolymer of vinylphenol and acrylic acid, a methacrylic acid derivative, acrylonitrile, a styrene derivative, or the like; a copolymer of isopropenylphenol and acrylic acid, a methacrylic acid derivative, acrylonitrile, a styrene derivative, or the like; an acrylic resin; a methacrylic resin; a copolymer of acrylic acid or methacrylic acid and acrylonitrile or a styrene derivative; and a copolymer of malonic acid and vinylether. More specifically, examples are poly(p-vinylphenol); a copolymer of p-isopropenylphenol and acrylonitrile (monomer ratio = 1 : 1); a copolymer of p-isopropenylphenol and styrene (monomer ratio = 1 : 1); a copolymer of p-vinylphenol and methylmethacrylate (monomer ratio = 1 : 1); and a copolymer of p-vinylphenol and styrene (monomer ratio = 1 : 1).

The photosensitive composition (A) according to the present invention contains the alkali-soluble polymer having a phenol skeleton in its structure described above and a heterocyclic compound represented by the following formula (I-1) or (I-2):

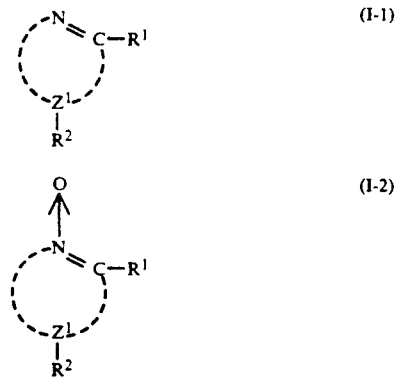

wherein $Z^1$ represents nonmetal atoms required to form a heterocyclic ring containing nitrogen, and $R^1$ and $R^2$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

This photosensitive composition can be suitably used as a negative resist.

Examples of a heterocyclic compound represented by formula (I-1) are pyridine or pyridine derivatives such as 2-ethylpyridine, 2,4-dimethylpyridine, 2-acetylpyridine, 2-methoxypyridine, 3-hydroxypyridine, 3-pyridine carboxylic acid, 2-chloropyridine, nicotineamide, and 2-phenylpyridine; quinoline or quinoline derivatives such as 4-methylquinoline, 2-chloroquinoline,- 8-hydroxyquinoline, 8-hydroxy-2-methylquinoline, 6-methoxyquinoline, and 4-quinoline carboxylic acid; acridine or acridine derivatives such as 3-methylacridine, 1-chloroacridine, and 3-aminoacridine; imidazole or imidazole derivatives such as 1-methylimidazole, and 2,4,5-triphenylimidazole; pyrazole or its derivatives; imidazoline or its derivatives; benzoimidazole or its derivatives; diazine such as pyridazine, pyrimidine, and pyrazine or its derivatives; benzodiazine such as phthalazine, quinazoline, and quinoxaline or its derivatives; 1,3,5-triazine or its derivatives; oxazole or its derivatives; and thiazole or its derivatives.

Examples of a heterocyclic compound represented by formula (I-2) are pyridine-1-oxide or pyridine-1-oxide derivatives such as 2-methylpyridine-1-oxide, 3-methylpyridine-1-oxide, 4-methylpyridine-1-oxide, 4-nitropyridine-1-oxide, 4-nitro-2-methylpyridine-1-oxide, 4-nitro-3,5-dimethylpyridine-1-oxide, 4-nitro-2,6-dimethylpyridine-1-oxide, 4-nitro-3-chloropyridine-1-oxide, 1-oxo-4-nitro-3-pyridine carboxylic acid, 4-acetylpyridine-1-oxide, 2-aminopyridine-1-oxide, 3-hydroxypyridine-1-oxide, and 2,6-dimethylpyridine-1-oxide; and quinoline-1-oxide or quinoline-1-oxide derivatives such a 4-nitroquinoline-1-oxide and 4-hydroxyaminoquinoline-1-oxide.

A mixing ratio of a heterocyclic compound represented by formula (I-1) or (I-2) with respect to the alkali-soluble polymer having a phenol skeleton in its structure is preferably 1 to 500 parts by weight, and more preferably, 0.1 to 200 parts by weight with respect to 100 parts by weight of the polymer. If the mixing ratio of the heterocyclic compound is less than 0.1 parts by weight, satisfactory photosensitivity may not be imparted to the composition. If the mixing ratio exceeds 200 parts by weight, exposing light rays do not reach the surface of a resist film made of the composition in contact with a substrate to make it difficult to form a pattern having a good sectional shape.

The photosensitive composition (B) according to the present invention contains the alkali-soluble polymer having a phenol skeleton in its structure and a heterocyclic compound represented by the following formula

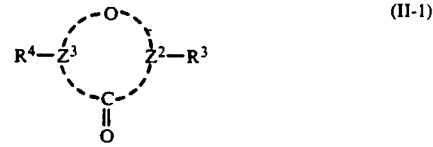

wherein $Z^2$ and $Z^3$ may be the same or different and independently represent nonmetal atoms required to form a heterocyclic ring containing oxygen, and $R^3$ and $R^4$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom; and

wherein $Z^4$ represents nonmetal atoms required to form a heterocyclic ring containing oxygen, and $R^5$ represents a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

This composition can be suitably used as a positive resist.

Examples of a heterocyclic compound represented by formula (II-1) are 4-pyrrone or 4-pyrrone derivatives such as 2,6-dimethyl-4-pyrrone, 3-hydroxy-4-pyrrone, 3-hydroxy-2-methyl-4-pyrrone, 4-pyrrone-2-carboxylic acid, 5-hydroxy-4-pyrrone-2-carboxylic acid, 4-pyrrone-2,6-dicarboxylic acid, 3-hydroxy-4-pyrrone-2,6-dicarboxylic acid, and 2,3-benzo-4-pyrrone; and 4-oxyzolone and its derivatives.

Examples of a heterocyclic compound represented by formula (II-2) are 2-pyrrone or 2-pyrrone derivatives such as 3-hydroxy-2-pyrrone, 4-hydroxy-6-methyl-2-pyrrone, 2-pyrrone-6-carboxylic acid, 5,6-benzo-2-pyrrone, and 3,4-benzo-2-pyrrone; hydrofuran derivatives such as 3-butene-4-olide-3-carboxylic acid and 3-oxo-4-butanolide; and benzofuran derivatives such as phthalide and 3,3-dimethylphthalide.

A mixing ratio of a heterocyclic compound represented by formula (II-1) or (II-2) with respect to the alkali-soluble polymer having a phenol skeleton in its structure is preferably 1 to 500 parts by weight, and more preferably, 0.1 to 200 parts by weight with respect to 100 parts by weight of the polymer. If the mixing ratio of the heterocyclic compound is less than 0.1 part by weight, satisfactory photosensitivity may not be imparted to the composition. If the mixing ratio exceeds 200 parts by weight, exposing light rays do not reach the surface of a resist film made of the composition in contact with a substrate to make it difficult to form a pattern having a good sectional shape.

The photosensitive composition (C) according to the present invention contains the alkali-soluble polymer having a phenol skeleton in its structure and a heterocyclic compound represented by one of the following formulas (III-1) or (III-8):

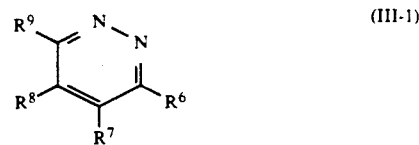

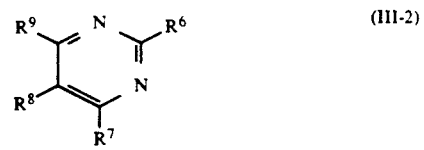

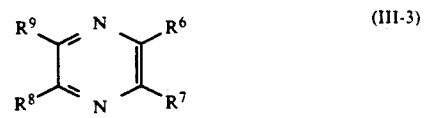

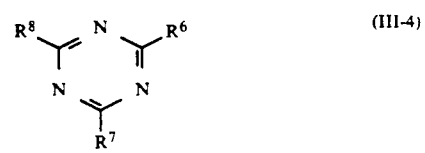

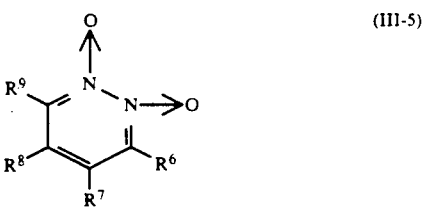

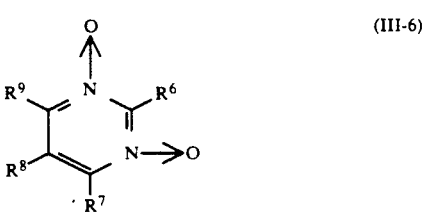

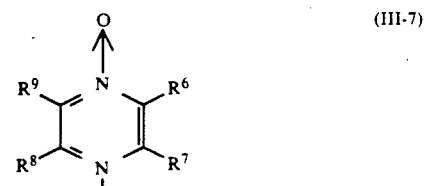

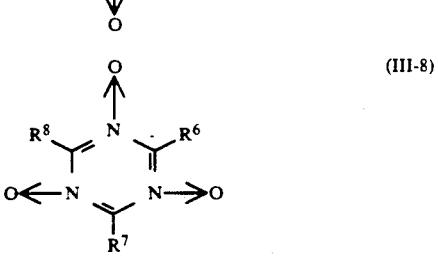

wherein $R^6$ too $R^9$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

This composition can be suitably used as a negative resist.

Examples of heterocyclic compounds represented by formulas (III-1) to (III-8) are pyridazine, 3-methylpyridazine, 4-methylpyridazine, pyrazine, 2,5-dimethylpyrazine, 1,2,5-triazine, 2,4,6-trichloro-1,3,5-triazine, pyridazine-N-oxide, 4-pyridazine-N-oxide, 4,5-dimethylpyridazine-N-oxide, 4,6-dimethylpyrimidine-N-oxide, 4-methoxypyrimidine-N-oxide, pyrazine-N-oxide, 2,3-dichloropyrazine-N-oxide, 2,6-dichloropyrazine-N-oxide, 1,3,5-triazine-N-oxide, 2,4,6-trimethoxy-1,3,5-triazine-N-oxide, and 2,4,6-triol-1,3,5-triazine-N-oxide. A heterocyclic N-oxide compound represented by any of formulas (III-5) to (III-8) can be synthesized in accordance with a method described in G. B. Payne, "The Journal of Organic Chemistry", Vol. 26, P. 659 (1961).

A mixing ratio of a heterocyclic compound represented by one of formulas (III-1) to (III-8) with respect to the alkali-soluble polymer having a phenol skeleton in its structure is preferably 1 to 300 parts by weight, and more preferably, 2 to 100 parts by weight with respect to 100 parts by weight of the polymer. If the mixing ratio of the heterocyclic compound is less than 1 part by weight, it is difficult to impart satisfactory photosensitivity to the composition. If the mixing ratio exceeds 300 parts by weight, transmittance of a resist film made of the composition is reduced to make it difficult for exposing light rays to reach a substrate side of the resist film. As a result, it becomes difficult to form a pattern having a good sectional shape.

The photosensitive composition (D) according to the present invention contains an alkali-soluble polymer having a phenol skeleton in its structure and a heterocyclic compound represented by one of the following formulas (IV-1) or (IV-12):

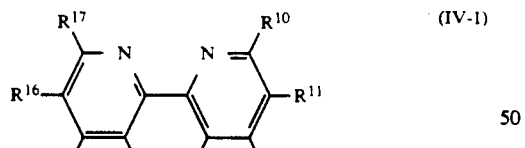
(IV-1)

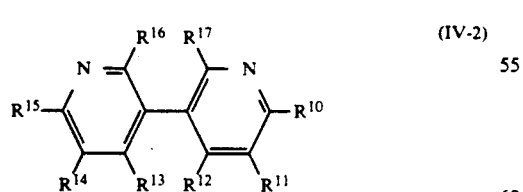
(IV-2)

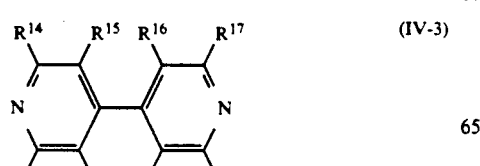
(IV-3)

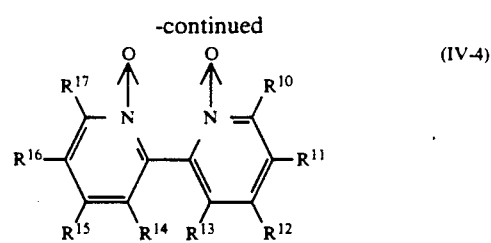
(IV-4)

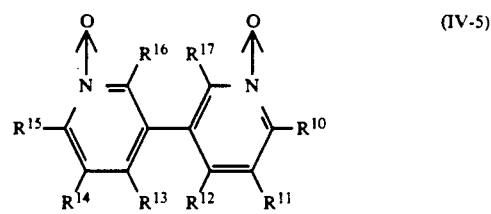
(IV-5)

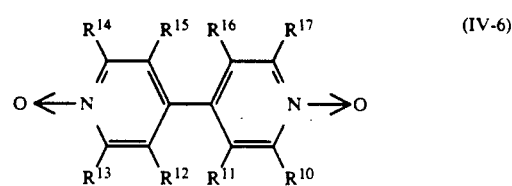
(IV-6)

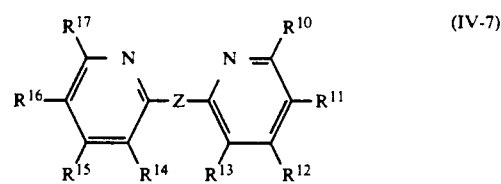
(IV-7)

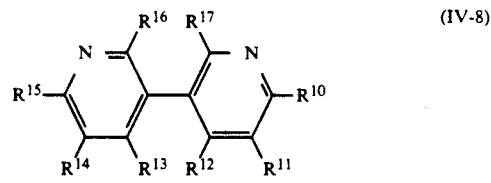
(IV-8)

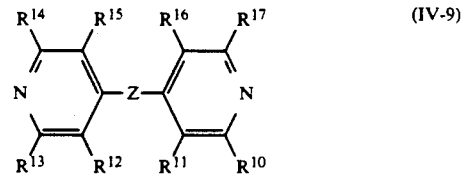
(IV-9)

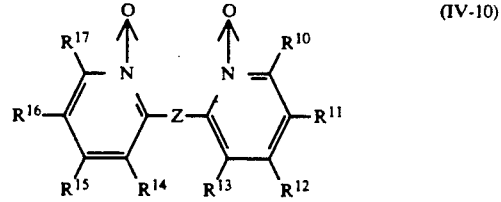
(IV-10)

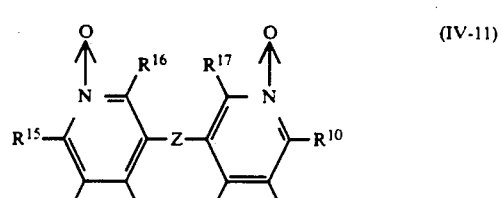
(IV-11)

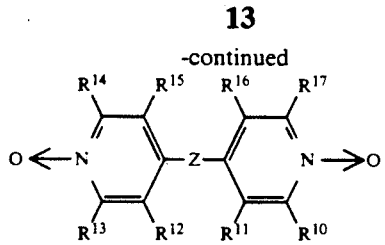

(IV-12)

wherein $R^{10}$ to $R^{17}$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom, and Z represents a divalent organic group.

This composition can be suitable used as a negative resist.

Examples of the divalent organic group Z to be introduced to compounds represented by formulas (IV-7) to (IV-12) are a methylene group, an ethylene group, a trimethylene group, a tetramethylene group, a vinylene group, 2-butenylene group, a malonyl group, a succinyl group, a glutaryl group, a fumaroyl group, a carbonyl group, an oxalyl group, a carbonyldioxy group, a sulfinyl group, sulfonyl group, a dithio group, a thiocarbonyl group, an imino group, a hydrazide group, an ureylene group, a carbonimidoyl group, and a formylimino group.

Examples of heterocyclic groups represented by formulas (IV-1) to (IV-12) are 2,2'-dipyridyl, di-2-pyridylketone, 2,2'-dipyridylamine, 3,3'-dipyridyl, 6,6'-dimethyl-3,3'-dipyridyl, di-3-pyridylketone, 4,4'-dipyridyl, 1,2-bis(4-pyridyl)ethane, 1,2-bis(4-pyridyl)ethylene, 2,2'-dipyridyl-N-oxide, 2,2'-dithiobis(pyridine-N-oxide), 1,2-bis(2-pyridyl)ethylene-N-oxide, 4,4'-dimethyl-2,2'-dipyridyl-N-oxide, di-1,2-pyridylketone-N-oxide, 3,3'-dipyridyl-N-oxide, 6,6'-dimethyl-3,3'-dipyridyl-N-oxide, 4,4'-dipyridyl-N-oxide, 1,2-bis(4-pyridyl)ethane-N-oxide, di-4-pyridylketone-N-oxide, and 3,3'-dimethyl-4,4'-dipyridyl-N-oxide.

In a heterocyclic compound represented by any of formulas (IV-4) to (IV-6) and (IV-10) to (IV-12), O (oxygen) is bonded to N (nitrogen) present in each of two heterocyclic rings. The heterocyclic compound is not limited to this type, but O may be bonded to N of only one of the two heterocyclic rings.

A mixing ratio of a heterocyclic compound represented by one of formulas (IV-1) to (IV-12) with respect to the alkali-soluble polymer having a phenol skeleton in its structure is preferably 1 to 300 parts by weight, and more preferably, 2 to 100 parts by weight with respect to 100 parts by weight of the polymer. If the mixing ratio of the heterocyclic compound is less than 1 part by weight, it is difficult to impart satisfactory photosensitivity to the composition. If the mixing ratio exceeds 300 parts by weight, transmittance of a resist film made of the composition is reduced to make it difficult for exposing light rays to reach a substrate side of the resist film. As a result, it becomes difficult to form a pattern having a good sectional shape.

The photosensitive composition (E) according to the present invention contains the alkali-soluble polymer having a phenol skeleton in its structure and a pyridinium salt represented by one of the following formulas (V-1) to (V-4):

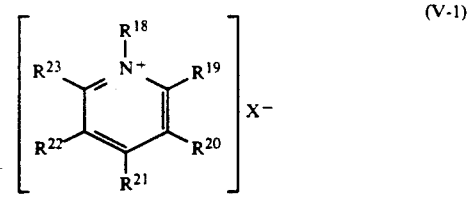
(V-1)

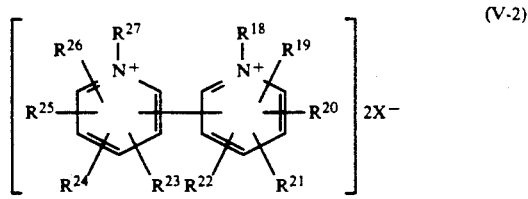
(V-2)

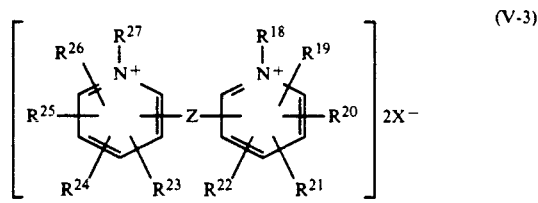
(V-3)

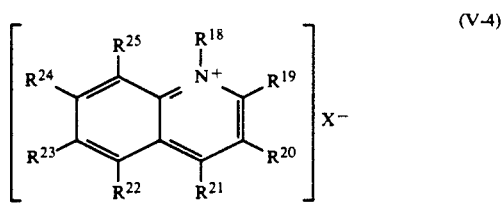
(V-4)

wherein $R^{18}$ to $R^{27}$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom, $X^-$ represents an anion, and Z represents a divalent organic group.

This composition can be suitably used as a negative resist.

Examples of the divalent organic group Z to be introduced to compounds represented by formulas (V-1) to (V-4) are a methylene group, an ethylene group, a trimethylene group, a tetramethylene group, a vinylene group, a 2-butenylene group, a malonyl group, a succinyl group, a glutaryl group, a fumaroyl group, a carbonyl group, an oxalyl group, a carbonyldioxy group, a sulfinyl group, a sulfonyl group, a dithio group, a thiocarbonyl group, an imino group, a hydrazide group, an ureylene group, a carbonimidoyl group, and a formylimino group.

Examples of the anion $X^-$ in formulas (V-1) to (V-4) are a halogen ion, a sulfate ion, a perchlorate ion, a sulfonate ion, and anions of halides of, e.g., boron, aluminum, iron, zinc, arsenic, antimony, and phosphorus.

Examples of pyridinium salts represented by formulas (V-1) to (V-4) are pyridinium-p-toluenesulfonate, 2-methylpyridinium-p-toluenesulfonate, 2-chloro-1-methylpyridinium-p-toluenesulfonate, 2,4,6-collidine-p-toluenesulfonate, 1-ethylpyridinium chloride, 1-pentylpyridinium chloride, 1-dodecylpyridinium chloride, 1-hexadecylpyridinium chloride, 1-benzyl-3-hydroxypyridinium chloride, 1-carboxymethylpyridinium chloride, 2,6-dimethyl-1-methylpyridinium chloride, 1,1'-dimethyl-4,4'-bipyridinium dichloride, 1,1'-dimethyl-4,4'-dimethyl-2,2'-bipyridinium dichloride, 2,4'-dipyridinium dichloride, 2,3'-dipyridinium dichloride, 1,2-bis(4-pyridinium)ethane dichloride, 1,2-bis(2-pyridinium)ethylene dichloride, 2,2'-dithiobispyridinium dichloride, di-2-pyridiniumketone dichloride, quinoxalinium-p-ethylsulfonate, and 8-hydroxy-1-methylquinoxalinium-p-toluenesulfonate.

A pyridinium salt represented by any of formulas (V-1) to (V-4) can bonded to water molecules and used.

A pyridinium salt represented by any of formulas (V-1) to (V-4) can be synthesized in accordance with a method described in, e.g., Japanese Chemical Society ed., "Experimental Chemistry Course 21, Synthesis of Organic Compound III", P. 290 (1958).

A mixing ratio of a pyridinium salt represented by one of formulas (V-1) to (V-4) with respect to the alkali-soluble polymer having a phenol skeleton in its structure is preferably 1 to 300 parts by weight and, more preferably, 5 to 100 parts by weight with respect to 100 parts by weight of the polymer. If the mixing ratio of the pyridinium salt is less than 1 part by weight, it is difficult to impart satisfactory photosensitivity to the composition. If the mixing ratio of the pyridinium salt exceeds 300 parts by weight, transmittance of a resist film made of the composition is reduced made it difficult for exposing light rays to reach a substrate side of the resist film. As a result, it becomes difficult to form a pattern having a good sectional shape.

The photosensitive composition (F) according to the present invention contains the alkali-soluble polymer having a phenol skeleton in its structure and a polymer having a nitrogen-containing heterocyclic compound as a polymeric unit.

This composition can be suitably used as a negative resist.

In a polymer having a nitrogen-containing heterocyclic compound as a polymeric unit, some or all of nitrogen atoms of the heterocyclic compound may be N-oxidized. In addition, the heterocyclic compound may have a pyridine ring to form a pyridinium salt. Examples of the heterocyclic compound are poly(2-vinylpyridine), poly(4-vinylpyridine), poly(2-vinyl-3-methylpyridine), poly(2-isopropenylpyridine), poly(4-vinylpyrimidine), poly(2-vinylpyrazine), poly(2-vinylpyridine-1-oxide), poly(2-vinyl-3-methylpyridine-1-oxide), poly(1-vinylpyridinium fluoroborate), poly(2-vinyl-1-methylpyridinium methylsulfate), poly(4-vinyl-1-methylpyridinium-p-toluenesulfonate), and copolymers of above described polymers and polystyrene, polymethylacrylate, polymethylmethacrylate, polypropylene, polyisobutylene, polyvinylphenol, polyisopropenylphenol, and the like.

The polymer having a nitrogen-containing heterocyclic compound as a polymeric unit ca be synthesized in accordance with methods described in, e.g., "Journal of American Chemical Society, Vol. 76, P. 1879 (1954)

and "Journal of Polymer Science", Vol. B-9, P. 13 (1971).

A mixing ratio of the polymer having a nitrogen-containing heterocyclic compound as a polymeric unit with respect to the alkali-soluble polymer having a phenol skeleton in its structure is preferably 5 to 400 parts by weight and, more preferably, 10 to 200 parts by weight with respect to 100 parts by weight of the alkali-soluble polymer. If the mixing ratio of the polymer having a nitrogen-containing heterocyclic group as a polymeric unit is less than 5 parts by weight, it is difficult to impart satisfactory photosensitivity to the composition. If the mixing ratio of the polymer exceeds 400 parts by weight, a dry etching resistance is reduced.

The photosensitive composition (F) may contain a heterocyclic compound represented by any of the following formulas (VI-1) to (VI-15) in addition to the alkali-soluble polymer having a phenol skeleton in its structure and the polymer having a nitrogen-containing heterocyclic compound as a polymeric unit, thereby increasing sensitivity to deep UV light.

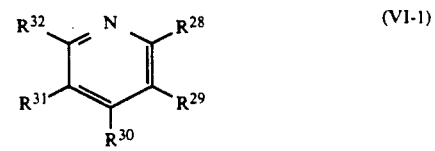

(VI-1)

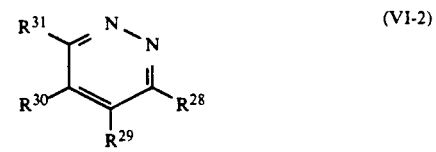

(VI-2)

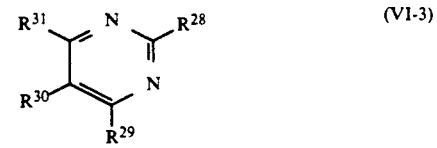

(VI-3)

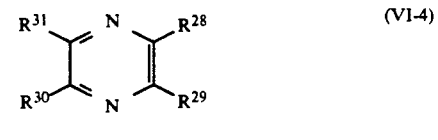

(VI-4)

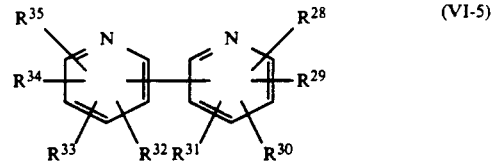

(VI-5)

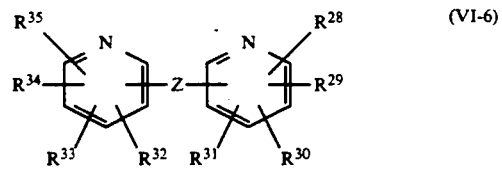

(VI-6)

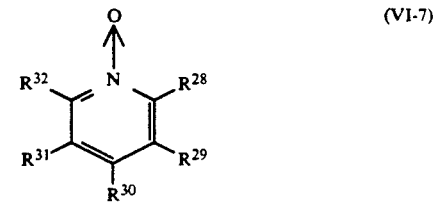

(VI-7)

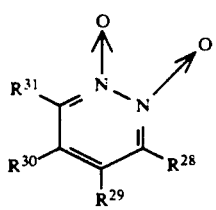 (VI-8)

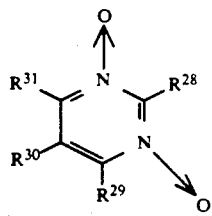 (VI-9)

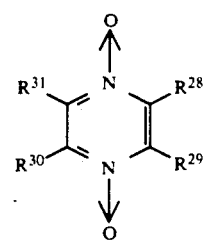 (VI-10)

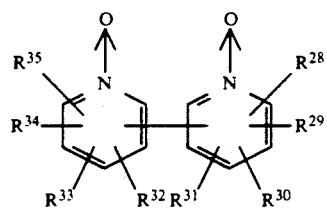 (VI-11)

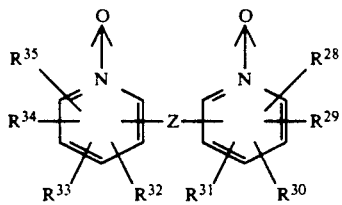 (VI-12)

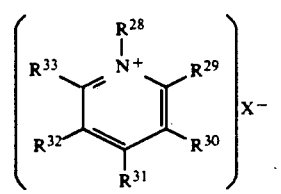 (VI-13)

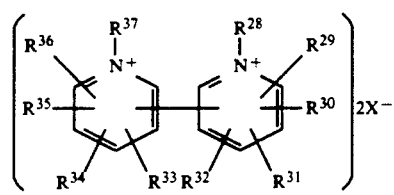 (VI-14)

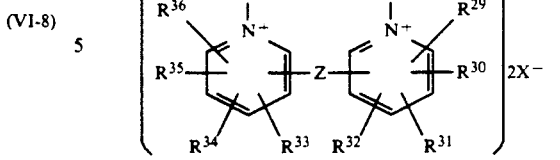 (VI-15)

wherein $R^{28}$ to $R^{38}$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom, $X^-$ represents an anion, and Z represents a divalent organic group.

Examples of the divalent organic group Z to be introduced to compounds represented by formulas (VI-6), (VI-12) and (VI-15) are a methylene group, an ethylene group, a trimethylene group, a tetramethylene group, a vinylene group, a 2-butenylene group, a malonyl group, a succinyl group, a glutaryl group, a fumaroyl group, a carbonyl group, an oxalyl group, a carbonyldioxy group, a sulfinyl group, a sulfonyl group, a dithio group, a thiocarbonyl group, an imino group, a hydrazide group, an ureylene group, a carbonimidoyl group, and a formylimino group.

Examples of the anion $X^-$ in formulas (VI-13) to (VI-15) are a halogen ion, a sulfate ion, a perchlorate ion, a sulfonate ion, and anions of halides of, e.g., boron, aluminum, iron, zinc, arsenic, antimony, and phosphorus.

Examples of heterocyclic compounds represented by formulas (VI-1) to (VI-6) are pyridine, 2-ethylpyridine, 2,4-dimethylpyridine, 2-acetylpyridine, 2-methoxypyridine, 3-hydroxypyridine, 3-pyridinecarboxylic acid, 2-chloropyridine, nicotineamide, 2-phenylpyridine, pyridazine, 3-methylpyridazine, 4-methylpyrimidine, pyrazine, 2,5-dimethylpyrazine, 2,2'-dipyridyl, di-2-pyridylketone, 2,2'-dipyridylamine, 3,3'-dipyridyl, 6,6'-dimethyl-3,3'-dipyridyl, di-3-pyridylketone, 4,4'-dipyridyl, 1,2-bis(4-pyridyl)ethane, and 1,2-bis(4-pyridyl)ethylene.

Examples of heterocyclic compounds represented by formulas (VI-7) to (VI-12) are pyridine-1-oxide, 2-methylpyridine-1-oxide, 3-methylpyridine-1-oxide, 4-methylpyridine-1-oxide, 4-nitropyridine-1-oxide, 4-nitro-2-methylpyridine-1-oxide, 4-nitro-3,5-dimethylpyridine-1-oxide, 4-nitro-2,6-dimethylpyridine-1-oxide, 4-nitro-3-chloropyridine-1-oxide, 1-oxo-4-nitro-3-pyridinecarboxyic acid, 4-acetylpyridine-1-oxide, 2-aminopyridine-1-oxide, 3-hydroxypyridine-1-oxide, 2,6-dimethylpyridine-1-oxide, pyridazine-N-oxide, 4-methylpyridazine-N-oxide, 4,5-dimethylpyridazine-N-oxide, 4,6-dimethylpyrimidine-N-oxide, 4-methoxypyrimidine-N-oxide, pyrazine-N-oxide, 2,3-dichloropyrazine-N-oxide, 2,6-dichloropyrazine-N-oxide, 2,2'-dipyridyl-N-oxide, 2,2'-dithiobis(pyridine-N-oxide), 1,2-bis(2-pyridyl)ethylene-N-oxide, 4,4'-dimethyl-2,2'-dipyridyl-N-oxide, di-1,2-pyridylketone-N-oxide, 3,3'-dipyridyl-N-oxide, 6,6'-dimethyl-3,3'-dipyridyl-N-oxide, 2,4'-dipyridyl-N-oxide, 1,2-bis(4-pyridyl)ethane-N-oxide, di-4-pyridylketone-N-oxide, and 3,3'-dimethyl-4,4'-dipyridyl-N-oxide.

Note that although O is bonded to each of two Ns in formulas (VI-8) to (VI-12), a heterocyclic compound in which O is bonded to only one of Ns can be used.

An N-oxide compound represented by any of formulas (VI-7) to (VI-12) can be synthesized in accordance with a method described in, e.g., "The Journal of Organic Chemistry", Vol. 26, P. 659 (1961).

Examples of pyridinium salts represented by formulas (VI-13) to (VI-15) are pyridinium-p-toluenesulfonate, 2-methylpyridinium-p-toluenesulfonate, 2-chloro-1-methylpyridinium-p-toluenesulfonate, 2,4,6-collidine-p-toluenesulfonate, 1-ethylpyridinium chloride, 1-dodecylpyridinium chloride, 1-benzyl-3-hydroxypyridinium chloride, 1-carboxymethylpyridinium chloride, 2,6-dimethyl-1-methylpyridinium chloride, 1,1'-dimethyl-4,4'-bipyridinium dichloride, 1,1'-dimethyl-4,4'-dimethyl-2,2'-bipyridinium dichloride, 2,4'-dipyridinium dichloride, 2,3'-dipyridinium dichloride, 1,2-bis(4-pyridinium)ethane dichloride, 1,2-bis(2-pyridinium)ethylene dichloride, 2,2'-dithiobispyridinium dichloride, di-2-pyridiniumketone dichloride, quinoxalinium-p-ethylsulfonate, and 8-hydroxy-1-methylquinoxalinium-p-toluenesulfonate.

A pyridinium salt represented by any of formulas (VI-13) to (VI-15) can be synthesized in accordance with a method described in, e.g., Japanese Chemical Society ed., "Experimental Chemistry Course 21, Synthesis of Organic Compound III", P. 290 (1958).

A pyridinium salt represented by any of formulas (VI-13) to (VI-15) can be used in the form of a hydrate bonded to water molecules.

A mixing ratio of a heterocyclic compound represented by one of formulas (VI-1) to (VI-15) is preferably 1 to 300 parts by weight and, more preferably, 2 to 100 parts by weight with respect to 100 parts by weight of the polymer mixture. If the mixing ratio of the heterocyclic compound is less than 1 part by weight, a sensitivity of the obtained photosensitive composition is reduced. If the mixing ratio exceeds 300 parts by weight, transmittance of a resist film made of the composition is reduced to make it difficult for exposing light rays to reach a substrate side of the resist film. As a result, it becomes difficult to form a pattern having a good sectional shape.

The photosensitive compositions (A) to (F) according to the present invention may contain a surfactant as a film modifier, a dye as a reflection inhibitor, and the like as needed in addition to the above components.

A pattern formation method using the photosensitive composition according to the present invention will be described below.

Any of the photosensitive compositions (A) to (F) is dissolved in an organic solvent to prepare a resist solution. Examples of the solvent are a ketone-based solvent such as cyclohexane, furfural, methylethyl-ketone, and methylisobutylketone; a cellosolve-based solvent such as methylcellosolve, methylcellosolve acetate, ethylcellosolve acetate, and butylcellosolve acetate; an ester-based solvent such as ethyl acetate, butyl acetate, isoamyl acetate, and ethyl lactate; an alcohol-based solvent such as 1-butanol, 2-butanol, isoamylalcohol, and diethyleneglycol; a polyvalent alcohol derivative-based solvent such as ethyleneglycol dimethylether, diethyleneglycol monoethylether, and ethylcarbitol; and a nitrogen compound-based solvent such as morpholine, N-methyl-2-pyrrolidone, benzonitrile, and pyridine. These solvents can be used singly or in a combination of two or more thereof.

Thereafter, the prepared resist solution is coated on a substrate by a conventional method such as a spin-coating method or a dipping method and then dried to form a resist film. Examples of the substrate on the surface of which the resist film is to be formed are a silicon wafer, a silicon wafer having steps formed by various insulating films, electrodes, and wirings, a semiconductor wafer consisting of a Group III-V compound such as GaAs and AlGaAs, a piezoelectric wafer consisting of, e.g., a rock crystal, lithium tantalate, and a blank mask.

Deep UV light is radiated on the resist film through a mask having a desired pattern to perform pattern exposure. A mercury lamp, for example, can be used as a light source of the deep UV light.

After pattern exposure, the resist film is developed by using an alkaline solution. When any of the photosensitive compositions (A) and (C) to (F) is used, a nonexposed portion of the resist film is dissolved and removed upon development, thereby forming a desired negative pattern. When the photosensitive composition (B) of the present invention is used, an exposed portion of the formed resist film is dissolved and removed upon development to form a positive pattern. Examples of the alkali solution for use in development of the resist film are an aqueous organic alkaline solution such as an aqueous tetramethylammoniumhydroxide (TMAH) solution and aqueous inorganic alkaline solutions such as an aqueous potassium hydroxide solution and an aqueous sodium hydroxide solution. As the developing method, a conventional dipping method, spraying method, or the like can be used. After development, rinsing can be performed by using, e.g., water.

The present invention will be described in more detail below by way of its examples.

EXAMPLE 1

100 g of poly(p-vinylphenol) and 20 g of 2-ethylpyridine were dissolved in 300 g of ethyl-cellosolve acetate. The resultant solution was filtered by using a 0.2 $\mu$m pore size-fluoroplastic membrane filter to prepare a resist solution.

This prepared resist solution was coated on a silicon wafer and dried on a hot plate at 90° C. for four minutes to form a 1.0 $\mu$m thick resist film. Thereafter, the formed resist film was pattern-exposed (200 mJ/cm$^2$) by using a reduction-projecting exposure apparatus using KrF excimer laser light (wavelength =248 nm). After pattern exposure, the resist film was dipped in an aqueous TMAH solution having a concentration of 0.95 wt % for one minute, to perform development.

As a result, a nonexposed portion of the resist film was dissolved and removed to obtain a highly precise resist pattern having a rectangular sectional shape with a line width of 0.40 $\mu$m.

EXAMPLE 2

100 g of a 3,5-xylenol novolak resin and 15 g of 2-chloropyridine were dissolved in 300 g of ethyl-cellosolve acetate. The resultant solution was filtered by using a 0.2 $\mu$m pore size-fluoroplastic membrane filter to prepare a resist solution.

A resist pattern was formed following the same procedures as in Example 1. Note that pattern exposure was performed at 260 mJ/cm$^2$ and the concentration of an aqueous TMAH solution was set to be 1.43 wt %.

As a result, a nonexposed portion of the resist film was dissolved and removed to obtain a resist pattern having a rectangular sectional shape with a line width of 0.40 μm.

EXAMPLE 3

100 g of poly(p-vinylphenol) and 20 g of 4-methylpyridine-1-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 1. Note that pattern exposure was performed at 180 mJ/cm$^2$.

As a result, a nonexposed portion of the resist film was dissolved and removed to obtain a resist pattern having a rectangular sectional shape with a line width of 0.35 μm.

EXAMPLE 4

100 g of a 3,5-xylenol novolak resin and 25 g of pyridine-N-oxide were dissolved in 300 g of ethyl-cellosolve acetate. The resultant solution was filtered by using a 0.2 μm pore size-fluoroplastic membrane filter to prepare a resist solution.

A resist pattern was formed following the same procedures as in Example 1. Note that pattern exposure was performed at 250 mJ/cm$^2$ and the concentration of an aqueous TMAH solution was set to be 1.43 wt %.

As a result, a nonexposed portion of the resist film was dissolved and removed to obtain a highly precise resist pattern having a rectangular sectional shape with a line width of 0.40 μm.

EXAMPLE 5

100 g of poly(p-vinylphenol) and 12 g of quinoline-1-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 1. Note that pattern exposure was performed at 180 mJ/cm$^2$.

As a result, a nonexposed portion of the resist film was dissolved and removed to obtain a highly precise resist pattern having a rectangular sectional shape with a line width of 0.35 μm.

EXAMPLE 6

100 g of poly(p-vinylphenol) and 25 g of 4-nitropyridine-N-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 1. Note that pattern exposure was performed at 140 mJ/cm$^2$.

As a result, a nonexposed portion of the resist film was dissolved and removed to obtain a highly precise resist pattern having a rectangular sectional shape with a line width of 0.35 μm.

EXAMPLE 7

The resist solution prepared in Example 3 was coated on the surface of an aluminum film (Al film) formed on a silicon wafer, and a resist pattern having a line width of 0.35 μm was formed following the same procedures as in Example 3.

By using the formed resist pattern as a mask, an exposed Al film was dry-etched by CBrCl$_3$ gas. As a result, the pattern having a line width of 0.35 μm similar to the resist pattern could be precisely transferred onto the Al film.

COMPARATIVE EXAMPLE 1

A polymethylmethacrylate solution was coated on the surface of an Al film formed on a silicon wafer, and a resist pattern was formed following the same procedures as in Example 1.

By using the formed resist pattern as a mask, an exposed Al film was dry-etched by CBrCl$_3$ gas. As a result, the polymethylmethacrylate pattern disappeared during etching of the Al film and therefore could not be perfectly transferred.

EXAMPLE 8

5 100 g of poly(p-vinylphenol) and 18 g of 3-hydroxy-2-methyl-4-pyrrone were dissolved in 300 g of ethylcellosolve acetate. The resultant solution was filtered by using a 0.2 μm pore size-fluoroplastic membrane filter to prepare a resist solution.

The prepared resist solution was coated on a silicon wafer and dried on a hot plate at 90° C. for one minute to form a 1.0 μm thick resist film. Thereafter, the formed resist film was pattern-exposed (200 mJ/cm$^2$) by using a reduction-projecting exposure apparatus using KrF excimer laser light (wavelength =248 nm). After pattern exposure, the resist film was dipped in an aqueous TMAH solution having a concentration of 0.95 wt % for one minute to perform development.

As a result, an exposed portion of the resist film was dissolved and removed to obtain a highly precise resist pattern having a rectangular sectional shape with a line width of 0.40 μm.

EXAMPLE 9

100 g of a 3,5-xylenol novolak resin and 15 g of 3-hydroxy-4-pyrrone were dissolved in 300 g of ethyl-cellosolve acetate. The resultant solution was filtered by using a 0.2 μm pore size-fluoroplastic membrane filter to prepare a resist solution.

A resist pattern was formed following the same procedures as in Example 8. Note that pattern exposure was performed at 240 mJ/cm$^2$ and the concentration of an aqueous TMAH solution was set to be 1.43 wt %.

As a result, an exposed portion of the resist film was dissolved and removed to obtain a highly precise resist pattern having a rectangular sectional shape with a line width of 0.40 μm.

EXAMPLE 10

100 g of poly(p-vinylphenol) and 15 g of 4-hydroxy-6-methyl-2-pyrrone were dissolved in 400 g of cyclohexanone. The resultant solution was filtered by using a 0.2 μm pore size-fluoroplastic membrane filter to prepare a resist solution.

A resist pattern was formed following the same procedures as in Example 8. Note that pattern exposure was performed at 220 mJ/cm$^2$.

As a result, an exposed portion of the resist film was dissolved and removed to obtain a highly precise resist pattern having a rectangular sectional shape with a line width of 0.40 μm.

EXAMPLE 11

The resist solution prepared in Example 8 was coated on the surface of an Al film formed on a silicon wafer, and a resist pattern having a line width of 0.40 μm was formed following the same procedures as in Example 8.

By using the formed resist pattern as a mask, an exposed Al film was dry-etched by $CBrCl_3$ gas. As a result, the pattern having a line width of 0.40 μm similar to the resist pattern could be precisely transferred onto the Al film.

EXAMPLE 12

100 g of poly(p-vinylphenol) and 20 g of 3-methylpyridazine were dissolved in 300 g of ethyl-cellosolve acetate. The resultant solution was filtered by using a 0.2 μm pore size-fluoroplastic membrane filter to prepare a resist solution.

The prepared resist solution was coated on a silicon wafer and dried on a hot plate at 90° C. for five minutes to form a 1.0 μm thick resist film. Thereafter, the formed resist film was pattern-exposed (500 mJ/cm$^2$) by using a reduction-projecting exposure apparatus using KrF excimer laser light (wavelength = 248 nm). After pattern exposure, the resist film was dipped in an aqueous TMAH solution having a concentration of 0.95 wt % for one minute to perform development.

As a result, a nonexposed portion of the resist film was dissolved and removed to obtain a highly precise resist pattern having a rectangular sectional shape with a line width of 0.40 μm.

EXAMPLE 13

100 g of a 3,5-xylenol novolak resin and 18 g of 4-methylpyridine were dissolved in 300 g of ethyl-cellosolve acetate. The resultant solution was filtered by using a 0.2 μm pore size-fluoroplastic membrane filter to prepare a resist solution.

A resist pattern was formed following the same procedures as in Example 12. Note that pattern exposure was performed at 580 mJ/cm$^2$ and the concentration of an aqueous TMAH solution was set to be 1.43 wt %.

As a result, a nonexposed portion of the resist film was dissolved and removed to obtain a highly precise negative pattern having a rectangular sectional shape with a line width of 0.40 μm.

EXAMPLE 14

100 g of poly(p-vinylphenol) and 20 g of 2,5-dimethylpyrazine were dissolved in 400 g of cyclohexanone. The resultant solution was filtered by using a 0.2 μm pore size-fluoroplastic membrane filter to prepare a resist solution.

A resist pattern was formed following the same procedures as in Example 12. Note that pattern exposure was performed at 480 mJ/cm$^2$.

As a result, a nonexposed portion of the resist film was dissolved and removed to obtain a highly precise negative pattern having a rectangular sectional shape with a line width of 0.40 μm.

EXAMPLE 15

100 g of a 3,5-xylenol novolak resin and 16 g of 1,3,5-triazine were dissolved in 300 g of ethyl-cellosolve acetate. The resultant solution was filtered by using a 0.2 μm pore size-fluoroplastic membrane filter to prepare a resist solution.

A resist pattern was formed following the same procedures as in Example 12. Note that the concentration of an aqueous TMAH solution was set to be 1.43 wt %.

As a result, a nonexposed portion of the resist film was dissolved and removed to obtain a highly precise negative pattern having a rectangular sectional shape with a line width of 0.40 μm.

EXAMPLE 16

100 g of poly(p-vinylphenol) and 18 g of pyridazine-N-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 12. Note that pattern exposure was performed at 220 mJ/cm$^2$.

As a result, a nonexposed portion of the resist film was dissolved and removed to obtain a highly precise negative pattern having a rectangular sectional shape with a line width of 0.35 μm.

EXAMPLE 17

100 g of poly(p-vinylphenol) and 18 g of 4,6-dimethylpyrimidine-N-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 12. Note that pattern exposure was performed at 180 mJ/cm$^2$.

As a result, a nonexposed portion of the resist film was dissolved and removed to obtain a highly precise negative pattern having a rectangular sectional shape with a line width of 0.35 μm.

EXAMPLE 18

100 g of poly(p-vinylphenol) and 20 g of 2,3-diethylpyrazine-N-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 12. Note that pattern exposure was performed at 160 mJ/cm$^2$.

As a result, a nonexposed portion of the resist film was dissolved and removed to obtain a highly precise negative pattern having a rectangular sectional shape with a line width of 0.35 μm.

EXAMPLE 19

100 g of poly(p-vinylphenol) and 16 g of 2,4,6-trimethoxy-1,3,5-triazine-N-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 12. Note that pattern exposure was performed at 160 mJ/cm$^2$.

As a result, a nonexposed portion of the resist film was dissolved and removed to obtain a highly precise negative pattern having a rectangular sectional shape with a line width of 0.35 μm.

EXAMPLE 20

The resist solution prepared in Example 18 was coated on the surface of an Al film formed on a silicon wafer, and a negative pattern having a line width of 0.35

μm was formed following the same procedures as in Example 18.

By using the formed resist pattern as a mask, an exposed Al film was dry-etched by $CBrCl_3$ gas.

As a result, the pattern having a line width of 0.35 μm similar to the resist pattern could be precisely transferred onto the Al film.

COMPARATIVE EXAMPLE 2

An Al film was formed on a silicon wafer, and a polymethylmethacrylate solution was coated on the surface of an Al film. Thereafter, a negative pattern was formed following the same procedures as in Example 12.

By using the formed negative pattern as a mask, an exposed Al film was dry-etched by $CBrCl_3$ gas.

As a result, the polymethylmethacrylate pattern disappeared during etching of the Al film and therefore could not be perfectly transferred.

EXAMPLE 21

100 g of poly(p-vinylphenol) and 20 g of 2,2'-dipyridylamine were dissolved in 300 g of ethylcellosolve acetate. The resultant solution was filtered by using a 0.2 μm pore size-fluoroplastic membrane filter to prepare a resist solution.

This prepared resist solution was coated on a silicon wafer and dried on a hot plate at 90° C. for five minutes to form a 1.0 μm thick resist film. Thereafter, the formed resist film was pattern-exposed (400 mJ/cm$^2$) by using a reduction-projecting exposure apparatus using KrF excimer laser light (wavelength =248 nm). After pattern exposure, the resist film was dipped in an aqueous TMAH solution having a concentration of 0.95 wt % for one minute to perform development.

As a result, a nonexposed portion of the resist film was dissolved and removed to obtain a highly precise resist pattern having a rectangular sectional shape with a line width of 0.40 μm.

EXAMPLE 22

100 g of a 3,5-xylenol novolak resin and 18 g of 3,3'-dipyridyl were dissolved in 300 g of ethylcellosolve acetate. The resultant solution was filtered by using a 0.2 μm pore size-fluoroplastic membrane filter to prepare a resist solution.

A resist pattern was formed following the same procedures as in Example 21. Note that pattern exposure was performed at 460 mJ/cm$^2$ and the concentration of an aqueous TMAH solution was set to be 1.43 wt %.

As a result, a nonexposed portion of the resist film was dissolved and removed to obtain a highly precise negative pattern having a rectangular sectional shape with a line width of 0.40 μm.

EXAMPLE 23

100 g of poly(p-vinylphenol) and 20 g of 4,4'-dipyridyl were dissolved in 400 g of cyclohexanone. The resultant solution was filtered by using a 0.2 μm pore size-fluoroplastic membrane filter to prepare a resist solution.

A resist pattern was formed following the same procedures as in Example 21. Note that pattern exposure was performed at 380 mJ/cm$^2$.

As a result, a nonexposed portion of the resist film was dissolved and removed to obtain a resist pattern having a rectangular sectional shape with a line width of 0.40 μm.

EXAMPLE 24

100 g of a poly(p-vinylphenol) and 10 g of 2,2'-dithiobis(pyridine-N-oxide) were dissolved in 400 g of cyclohexanone. The resultant solution was filtered by using a 0.2 μm pore size-fluoroplastic membrane filter to prepare a resist solution.

A resist pattern was formed following the same procedures as in Example 21. Note that pattern exposure was performed at 280 mJ/cm$^2$.

As a result, a nonexposed portion of the resist film was dissolved and removed to obtain a highly precise negative pattern having a rectangular sectional shape with a line width of 0.35 μm.

EXAMPLE 25

100 g of a 3,5-xylenol novolak resin and 8 g of 3,3'-dipyridyl-N-oxide were dissolved in 300 g of cyclohexanone. The resultant solution was filtered by using a 0.2 μm pore size-fluoroplastic membrane filter to prepare a resist solution.

A resist pattern was formed following the same procedures as in Example 21. Note that pattern exposure was performed at 320 mJ/cm$^2$ and the concentration of an aqueous TMAH solution was set to be 1.43 wt %.

As a result, a nonexposed portion of the resist film was dissolved and removed to obtain a highly precise negative pattern having a rectangular sectional shape with a line width of 0.35 μm.

EXAMPLE 26

100 g of poly(p-vinylphenol) and 10 g of 1,2-bis(4-pyridyl)ethane-N-oxide were dissolved in 400 g of cyclohexanone. The resultant solution was filtered by using a 0.2 μm pore size-fluoroplastic membrane filter to prepare a resist solution.

A resist pattern was formed following the same procedures as in Example 21. Note that pattern exposure was performed at 240 mJ/cm$^2$.

As a result, a nonexposed portion of the resist film was dissolved and removed to obtain a highly precise negative pattern having a rectangular sectional shape with a line width of 0.35 μm.

EXAMPLE 27

An Al film was formed on a silicon wafer, and the resist solution prepared in Example 26 was coated on the surface of the Al film. Thereafter, a negative pattern having a line width of 0.35 μm was formed following the same procedures as in Example 26.

By using the formed negative pattern as a mask, an exposed Al film was dry-etched by $CBrCl_3$ gas.

As a result, the pattern having a line width of 0.35 μm could be precisely transferred onto the Al film.

EXAMPLE 28

100 g of poly(p-vinylphenol) and 25 g of pyridinium-p-toluenesulfonate were dissolved in a solvent mixture consisting of 400 g of cyclohexanone and 50 g of ethyl lactate. The resultant solution was filtered by using a 0.2 μm pore size-fluoroplastic membrane filter to prepare a resist solution.

This prepared resist solution was coated on a silicon wafer and dried on a hot plate at 90° C. for five minutes to form a 1.0 μm thick resist film. Thereafter, the formed resist film was pattern-exposed (360 mJ/cm$^2$) by using a reduction-projecting exposure apparatus using KrF excimer laser light (wavelength =248 nm). After pattern exposure, the resist film was dipped in an aqueous TMAH solution having a concentration of 0.95 wt % for one minute to perform development.

As a result, a nonexposed portion of the resist film was dissolved and removed to obtain a highly precise resist pattern having a rectangular sectional shape with a line width of 0.35 μm.

EXAMPLE 29

100 g of a 3,5-xylenol novolak resin and 20 g of 2,4,6-collidine-p-toluenesulfonate were dissolved in 300 g of ethylcellosolve acetate. The resultant solution was filtered by using a 0.2 μm pore size-fluoroplastic membrane filter to prepare a resist solution.

A resist pattern was formed following the same procedures as in Example 28. Note that pattern exposure was performed at 380 mJ/cm$^2$ and the concentration of an aqueous TMAH solution was set to be 1.43 wt %.

As a result, a nonexposed portion of the resist film was dissolved and removed to obtain a highly precise negative pattern having a rectangular sectional shape with a line width of 0.40 μm.

EXAMPLE 30

100 g of poly(p-vinylphenol) and 18 g of 1,1'-dimethyl-4,4'-bipyridiniumchloride were dissolved in 400 g of cyclohexanone. The resultant solution was filtered by using a 0.2 μm pore size-fluoroplastic membrane filter to prepare a resist solution.

A resist pattern was formed following the same procedures as in Example 28. Note that pattern exposure was performed at 280 mJ/cm$^2$ and the concentration of an aqueous TMAH solution was set to be 0.85 wt %.

As a result, a nonexposed portion of the resist film was dissolved and removed to obtain a highly precise negative pattern having a rectangular sectional shape with a line width of 0.40 μm.

EXAMPLE 31

100 g of a 3,5-xylenol novolak resin and 20 g of 1,2-bis(4-pyridinium)ethane dichloride were dissolved in 300 g of ethylcollosolve acetate. The resultant solution was filtered by using a 0.2 μm pore size-fluoroplastic membrane filter to prepare a resist solution.

A resist pattern was formed following the same procedures as in Example 28. Note that pattern exposure was performed at 340 mJ/cm$^2$ and the concentration of an aqueous TMAH solution was set to be 1.43 wt %.

As a result, a nonexposed portion of the resist film was dissolved and removed to obtain a highly precise negative pattern having a rectangular sectional shape with a line width of 0.40 μm.

EXAMPLE 32

100 g of poly(p-vinylphenol) and 20 g of quinoxalinium-p-ethylsulfonate were dissolved in 400 g of cyclohexanone. The resultant solution was filtered by using a 0.2 μm pore size-fluoroplastic membrane filter to prepare a resist solution.

A resist pattern was formed following the same procedures as in Example 28. Note that pattern exposure was performed at 300 mJ/cm$^2$ and the concentration of an aqueous TMAH solution was set to be 0.85 wt %.

As a result, a nonexposed portion of the resist film was dissolved and removed to obtain a highly precise negative pattern having a rectangular sectional shape with a line width of 0.40 μm.

EXAMPLE 33

An Al film was formed on a silicon wafer, and the resist solution prepared in Example 28 was coated on the surface of an Al film. Thereafter, a negative pattern having a line width of 0.35 μm was formed following the same procedures as in Example 28. Note that pattern exposure was performed at 320 mJ/cm$^2$.

By using the formed negative pattern as a mask, an exposed Al film was dry-etched by CBrCl$_3$ gas.

As a result, the pattern having a line width of 0.35 μm could be precisely transferred onto the Al film.

COMPARATIVE EXAMPLE 3

An Al film was formed on a silicon wafer, and a polymethylmethacrylate solution was coated on the surface of the Al film. Thereafter, a negative pattern was formed following the same procedures as in Example 8.

By using the formed negative pattern as a mask, an exposed Al film was dry-etched by CBrCl$_3$ gas.

As a result, the polymethylmethacrylate pattern disappeared during etching of the Al film and therefore could not be perfectly transferred.

EXAMPLE 34

100 g of poly(p-vinylphenol) and 80 g of poly(2-vinylpyridine-CO-styrene) were dissolved in 500 g of ethylcellosolve acetate. The resultant solution was filtered by using a 0.2 μm pore size-fluoroplastic membrane filter to prepare a resist solution.

This prepared resist solution was coated on a silicon wafer and dried on a hot plate at 90° C. for five minutes to form a 1.0 μm thick resist film. Thereafter, the formed resist film was pattern-exposed (580 mJ/cm$^2$) by using a reduction-projecting exposure apparatus using KrF excimer laser light (wavelength =248 nm). After pattern exposure, the resist film was dipped in an aqueous TMAH solution having a concentration of 0.95 wt % for one minute to perform development.

As a result, a nonexposed portion of the resist film was dissolved and removed to obtain a highly precise resist pattern having a rectangular sectional shape with a line width of 0.40 μm.

EXAMPLE 35

100 g of poly(p-vinylphenol) and 50 g of poly(2-vinylpyridine-1-oxide) were dissolved in 600 g of cyclohexanone. The resultant solution was filtered by using a 0.2 μm pore size-fluoroplastic membrane filter to prepare a resist solution.

A resist pattern was formed following the same procedures as in Example 34. Note that pattern exposure was performed at 400 mJ/cm$^2$.

As a result, a nonexposed portion of the resist film was dissolved and removed to obtain a highly precise negative pattern having a rectangular sectional shape with a line width of 0.40 μm.

EXAMPLE 36

100 g of poly(p-vinylphenol) and 60 g of poly(4-vinyl-1-methylpyridinium-p-toluenesulfonate) were dissolved in a solvent mixture consisting of 500 g of cyclohexanone and 100 g of ethyl lactate. The resultant solution was filtered by using a 0.2 μm pore size-fluoroplastic membrane filter to prepare a resist solution.

A resist pattern was formed following the same procedures as in Example 34. Note that pattern exposure was performed at 320 mJ/cm².

As a result, a nonexposed portion of the resist film was dissolved and removed to obtain a highly precise negative pattern having a rectangular sectional shape with a line width of 0.40 μm.

EXAMPLES 37–41

100 g of poly(p-vinylphenol), 20 g of poly(4-vinylpyridine-CO-styrene), and each of heterocyclic compounds listed in Table 1 were dissolved in 600 g of cyclohexanone. Addition amounts of the heterocyclic compounds are also listed in Table 1. The resultant solutions were filtered by using a 0.2 μm pore size-fluoroplastic membrane filter to prepare resist solutions of Examples 37 to 41.

Resist patterns were formed following the same procedures as in Example 34 by using the prepared resist solutions. Note that pattern exposure was performed for the respective resist patterns at exposure amounts listed in Table 1.

As a result, a nonexposed portion of each resist film was dissolved and removed to obtain a highly precise negative pattern having a rectangular sectional shape with a line width listed in Table 1.

TABLE 1

| Example | Heterocyclic Compound | Addition Amount (g) | Exposure Amount (mJ/cm²) | Resolving Line width (μm) |
|---|---|---|---|---|
| 37 | 2,5-dimethyl pyrazine | 30 | 380 | 0.40 |
| 38 | 4,4'-dipyridyl | 18 | 340 | 0.40 |
| 39 | 2,6-dimethyl pyridine-1-oxide | 30 | 200 | 0.35 |
| 40 | 4,4'-dimethyl-2,2'-dipyridyl-N-oxide | 20 | 180 | 0.40 |
| 41 | di-2-pyridinium ketone dichloride | 15 | 200 | 0.35 |

EXAMPLES 42–46

100 g of poly(p-vinylphenol), 15 g of poly(2-vinyl-3-methylpyridine-1-oxide), and each of heterocyclic compounds listed in following Table 2 were dissolved in 600 g of cyclohexanone. Addition amounts of the heterocyclic compounds are also listed in Table 2. The resultant solutions were filtered by using a 0.2 μm pore size-fluoroplastic membrane filter to prepare resist solutions in Examples 42 to 46.

The prepared resist solutions were used to form resist patterns following the same procedures as in Example 34. Note that pattern exposure was performed for the respective resists patterns at exposure amounts listed Table 2.

As a result, a nonexposed portion of each resist film was dissolved and removed to obtain a highly precise negative pattern having a rectangular sectional shape with a line width listed in Table 2.

TABLE 2

| Example | Heterocyclic Compound | Addition Amount (g) | Exposure Amount (mJ/cm²) | Resolving Line width (μm) |
|---|---|---|---|---|
| 42 | 4-methyl pyrimidine | 30 | 240 | 0.40 |
| 43 | 1,2-bis(4-pyridyl)ethane | 20 | 180 | 0.40 |
| 44 | 4,5-dimethyl pyridazine-N-oxide | 25 | 180 | 0.35 |
| 45 | 2,6-dichloro pyrazine-N-oxide | 22 | 200 | 0.40 |
| 46 | 2-methyl pyridinium-p-toluenesulfonate | 20 | 220 | 0.35 |

EXAMPLES 47–51

100 g of poly(p-vinylphenol), 18 g of poly(2-vinyl-1-methylpyridinium methylsulfate), and each of heterocyclic compounds listed in following Table 3 were dissolved in a solvent mixture consisting of 500 g of cyclohexanone and 100 g of ethyl lactate. Addition amounts of the heterocyclic compounds are also listed in Table 3. The resultant solutions were filtered by using a 0.2 μm pore size-fluoroplastic membrane filter to prepare resist solutions in Examples 47 to 51.

The prepared resist solutions were used to form resist patterns following the same procedures as in Example 34. Note that pattern exposure was performed for the respective resists patterns at exposure amounts listed Table 3.

As a result, a nonexposed portion of each resist film was dissolved and removed to obtain a highly precise negative pattern having a rectangular sectional shape with a line width listed in Table 3.

TABLE 3

| Example | Heterocyclic Compound | Addition Amount (g) | Exposure Amount (mJ/cm²) | Resolving Line width (μm) |
|---|---|---|---|---|
| 47 | 2,4-dimethyl pyrizine | 30 | 220 | 0.40 |
| 48 | 3-methyl pyridazine | 25 | 200 | 0.40 |
| 49 | 4-methoxy pyrimidine-N-oxide | 25 | 200 | 0.35 |
| 50 | 1,2-bis(4-pyridyl)ethane-N-oxide | 20 | 180 | 0.35 |
| 51 | 1,1'-dimethyl-4,4'-dimethyl-2,2'-bipyridinium dichloride | 18 | 180 | 0.35 |

EXAMPLE 51

An Al film was formed on a silicon wafer, and the resist solution prepared in Example 39 was coated on the Al film. Thereafter, a negative pattern having a line width of 0.35 μm was formed following the same procedures as in Example 34. Note that pattern exposure was performed at 200 mJ/cm².

By using the formed negative pattern as a mask, an exposed Al film was dry-etched by $CBrCl_3$ gas.

As a result, the pattern having a line width of 0.35 μm could be precisely transferred onto the Al film.

COMPARATIVE EXAMPLE 4

An Al film was formed on a silicon wafer, and a polymethylmethacrylate solution was coated on the Al film. Thereafter, a negative pattern was formed following the same procedures as in Example 34.

By using the formed negative pattern as a mask, an exposed Al film was dry-etched by CBrCl₃ gas.

As a result, the polymethylmethacrylate pattern disappeared during etching of the Al film and therefore could not be perfectly transferred.

Additional advantages and modifications will readily occur to those skilled in the art. Therefore, the invention in its broader aspects is not limited to the specific details, and illustrated examples shown and described. Accordingly, various modifications may be made without departing from the spirit or scope of the general inventive concept as defined by the appended claims and their equivalents.

What is claimed is:

1. A negative type photosensitive composition containing an alkali-soluble polymer having a phenol skeleton in its structure and a heterocyclic compound represented by the following formula (I-1) or (I-2):

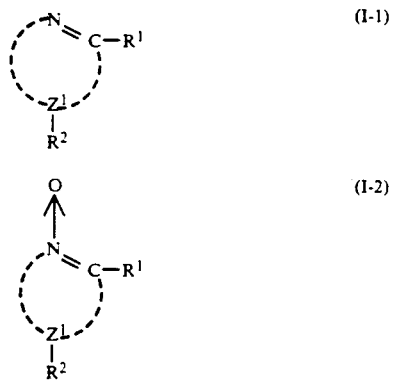

wherein $Z^1$ in formula (I-1) represents 4 nonmetal atoms required to form a heterocyclic ring containing nitrogen, $Z^1$ in formula (I-2) represents nonmetal atoms required to form a heterocyclic ring containing nitrogen, and $R^1$ and $R^2$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carbvoxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

2. A composition according to claim 1, wherein said heterocyclic compound represented by formula (I-1) or (I-2) is selected from the group consisting of pyridine or a pyridine derivative, diazine or a diazine derivative, and 1,3,5-triazine or a 1,3,5-triazine derivative.

3. A composition according to claim 2, wherein a mixing ratio of said heterocyclic compound represented by formula (I-1) or (I-2) is 1 to 500 parts by weight with respect to 100 parts by weight of said alkali-soluble polymer having a phenol skeleton in its structure.

4. A composition according to claim 1, wherein said heterocyclic compound represented by formula (I-1) or (I-2) is selected from the group consisting of pyridine-1-oxide or a pyridine-1-oxide derivative, and quinoline-1-oxide or a quinoline-1-oxide derivative.

5. A composition according to claim 4, wherein a mixing ratio of said heterocyclic compound represented by formula (I-1) or (I-2) is 1 to 500 parts by weight with respect to 100 parts by weight of said alkali-soluble polymer having a phenol skeleton in its structure.

6. A composition according to claim 1, wherein:
said alkali-soluble polymer having a phenol skeleton in its structure is selected from the group consisting of a phenol novolak resin, a cresol novolak resin, a xylenol novolak resin, a vinylphenol resin, an isopropenylphenol resin, a copolymer of vinylphenol and, e.g., acrylic acid, a methacrylic acid derivative, acrylonitrile, or a styrene derivative, a copolymer of isopropenylphenol and, e.g., acrylic acid, a methacrylic acid derivative, acrylonitrile, or a styrene derivative, an acrylic resin, a methacrylic resin, a copolymer of acrylic acid or methacrylic acid and acrylonitrile or a styrene derivative, and a copolymer of a malonic acid and vinylether; and
said heterocyclic compound represented by formula (I-1) or (I-2) is selected from the group consisting of 2-ethylpyridine, 2,4-dimethylpyridine, 2-acetylpyridine, 2-methoxypyridine, 3-hydroxypyridine, 3-pyridine-carboxylic acid, 2-chloropyridine, nicotineamide, 2-phenylpyridine, pyridazine, pyrimidine and pyrazine.

7. A composition according to claim 6, wherein a mixing ratio of said heterocyclic compound represented by formula (I-1) or (I-2) is 1 to 500 parts by weight with respect to 100 parts by weight of said alkali-soluble polymer having a phenol skeleton in its structure.

8. A commission according to claim 1, wherein:
said alkali-soluble polymer having a phenol skeleton in its structure is selected from the group consisting of a phenol novolak resin, a cresol novolak resin, a xylenol novolak resin, a vinylphenol resin, an isopropenylphenol resin, a copolymer of vinylphenol and, e.g., acrylic acid, a methacrylic acid derivative, acrylonitrile, or a styrene derivative, a copolymer of isopropenylphenol and, e.g., acrylic acid, a methacrylic acid derivative, acrylonitrile, or a styrene derivative, an acrylic resin, a methacrylic resin, a copolymer of acrylic acid or methacrylic acid and acrylonitrile or a styrene derivative, and a copolymer of a malonic acid and vinylether; and
said heterocyclic compound represented by formula (I-1) or (I-2) is selected from the group consisting of 2-methylpyridine-1-oxide, 3-methylpyridine1-oxide, 4-methlpyridine1-oxide, 4-nitropyridine1-oxide, 4-nitro-2-methylpyridine1-oxide, 4-nitro-3,5-dimethylpyridine1-oxide, 4-nitro-2,6-dimethylpyrdiine1-oxide, 4-nitro-3-chloropyridine1-oxide, 1-oxo-4-nitro-3-pyridinecarboxylic acid, 4acetylpyradzaine1-oxide, 2-aminopyridine1-oxide, 3-hydroxypyridine1-oxide, 2,6dimethylpyridine1-oxide, 4-nitroquinoline1-oxide, and 4-hydroxyaminoquinoline1-oxide.

9. A composition according to claim 8, wherein a mixing ratio of said heterocyclic compound represented by formula (I-1) or (I-2) is 1 to 500 parts by weight with respect to 100 parts by weight of said alkali-soluble polymer having a phenol skeleton in its structure.

10. A composition according to claim 1, wherein a mixing ratio of said heterocyclic compound represented by formula (I-1) or (I-2) is 1 to 500 parts by weight with respect to 100 parts by weight of said alkali-soluble polymer having a phenol skeleton in its structure.

11. A negative type photosensitive composition containing an alkali-soluble polymer having a phenol skeleton in its structure and a heterocyclic compound represented by the following formula (I-2):

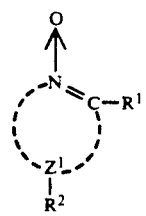
(I-2)

wherein $Z^1$ represents nonmetal atoms required to form a heterocyclic ring containing nitrogen, and $R^1$ and $R^2$ may be the same or different and independently represent a hydrogen atom, a substituted or nonsubstituted alkyl group having 1 to 20 carbon atoms, an alkoxy group, an acyl group, an alkenyl group, a hydroxyl group, an amino group, a dialkylamino group having 1 to 5 carbon atoms, a nitro group, a carboxyl group, a methoxycarbonyl group, an ethoxycarbonyl group, a carboxymethyl group, a carboxyethyl group, a carbamoyl group, a phenyl group, a tolyl group, a xylyl group, a mesityl group, a benzyl group, a styryl group, a cinnamyl group, a mercapto group, a cyano group, and a halogen atom.

12. A composition according to claim 11, wherein a mixing ratio of said heterocyclic compound represented by formula (I-1) or (I-2) is 1 to 500 parts by weight with respect to 100 parts by weight of said alkali-soluble polymer having a phenol skeleton in its structure.

* * * * *